(12) United States Patent
    Wattyn

(10) Patent No.: US 10,919,330 B2
(45) Date of Patent: Feb. 16, 2021

(54) FLEXOGRAPHY PRINTING

(71) Applicant: Xeikon Prepress N.V., Ypres (BE)

(72) Inventor: Bart Mark Luc Wattyn, Dentergem (BE)

(73) Assignee: Xeikon Prepress N.V., Ypres (BE)

( * ) Notice: Subject to any disclaimer, the term of this patent is extended or adjusted under 35 U.S.C. 154(b) by 312 days.

(21) Appl. No.: 16/063,926

(22) PCT Filed: Dec. 19, 2016

(86) PCT No.: PCT/EP2016/081732
    § 371 (c)(1),
    (2) Date: Jun. 19, 2018

(87) PCT Pub. No.: WO2017/108684
    PCT Pub. Date: Jun. 29, 2017

(65) Prior Publication Data
    US 2019/0009606 A1    Jan. 10, 2019

(30) Foreign Application Priority Data

Dec. 23, 2015  (NL) ..................................... 2016019

(51) Int. Cl.
    *B41N 1/12*    (2006.01)
    *B41C 1/05*    (2006.01)
    *B41M 1/04*    (2006.01)
    *B41F 5/24*    (2006.01)
    *B41N 1/22*    (2006.01)

(52) U.S. Cl.
    CPC .................. *B41N 1/12* (2013.01); *B41C 1/05* (2013.01); *B41F 5/24* (2013.01); *B41M 1/04* (2013.01); *B41N 1/22* (2013.01)

(58) Field of Classification Search
    CPC .... B41C 1/05; B41F 5/24; B41N 1/12; B41N 1/22; B41M 1/04
    See application file for complete search history.

(56) References Cited

U.S. PATENT DOCUMENTS

| 5,602,572 A | 2/1997 | Rylander |
| 2007/0002384 A1 | 1/2007 | Samworth et al. |

FOREIGN PATENT DOCUMENTS

| EP | 0777579 | 6/1997 |
| WO | 9605967 A1 | 2/1996 |

*Primary Examiner* — Matthew G Marini
*Assistant Examiner* — Marissa Ferguson-Samreth
(74) *Attorney, Agent, or Firm* — The Webb Law Firm

(57) ABSTRACT

A flexographic printing plate includes at least one halftone printing area with a plurality of halftone dots. A halftone dot of said plurality of halftone dots is shaped as a relief area. Said relief area includes a central portion and a surrounding portion. Said central portion has a central dot floor with a first pattern of a plurality of pins protruding upwardly from the central dot floor. Said surrounding portion protrudes upwardly from the central dot floor and has a top side including a second pattern of a plurality of recesses. The first pattern and second pattern are such that the surrounding portion can be distinguished from the central portion.

12 Claims, 4 Drawing Sheets

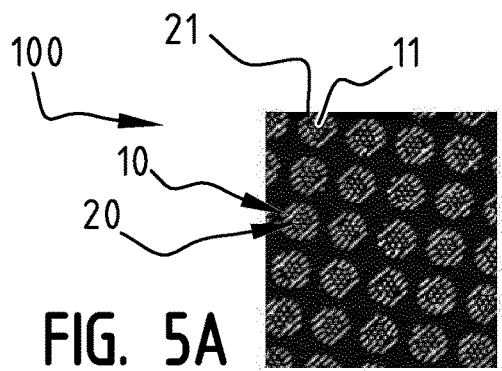
FIG. 5A
FIG. 6A
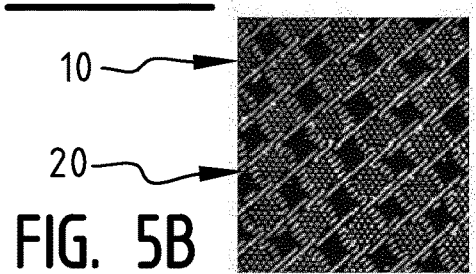
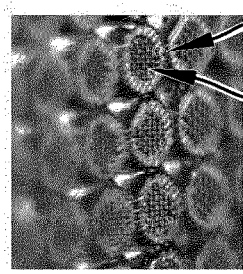
FIG. 5B
FIG. 6B
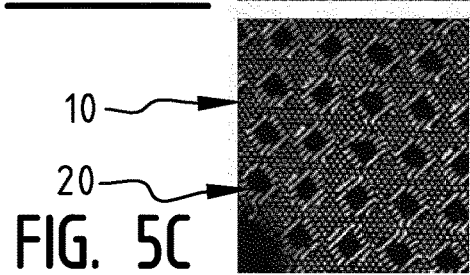
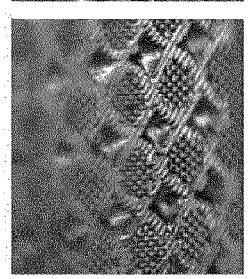
FIG. 5C
FIG. 6C
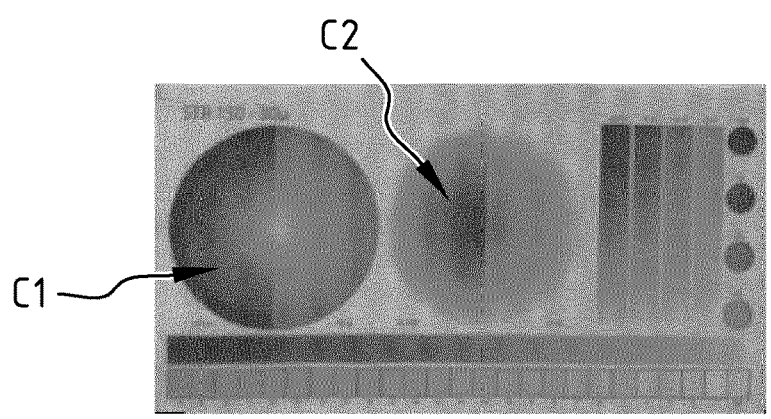
FIG. 7A
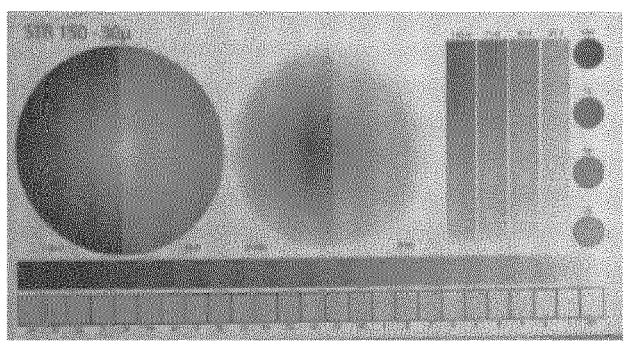
FIG. 7B

FLEXOGRAPHY PRINTING

CROSS-REFERENCE TO RELATED APPLICATIONS

This application is the United States national phase of International Application No. PCT/EP2016/081732 filed Dec. 19, 2016, and claims priority to Dutch Patent Application No. 2016019 filed Dec. 23, 2015, the disclosures of which are hereby incorporated in their entirety by reference.

BACKGROUND OF THE INVENTION

Field of the Invention

The field of the invention relates to flexography printing. Particular embodiments relate to a printing plate, in particular a flexographic printing plate comprising at least one halftone printing area with a plurality of halftone dots, a method for producing a plate layout, a method for making a flexographic printing plate, and a computer program product for performing steps of the method.

DESCRIPTION OF RELATED ART

Flexography printing is a printing method that uses resilient relief image plates of a resilient material such as rubber, including photopolymers to print an image on diverse types of absorbent or non absorbent materials, such as plastic films, cardboard, etc., e.g. for use in the packaging and label industry.

In prior art embodiments flexographic printing plates are arranged onto a printing roller for printing. Ink is applied on the flexographic printing plate using e.g. a metering roller. The material to be printed on, e.g supplied as a continuous web, is placed between the printing roller and a backing. The flexographic printing plate is brought against the material with a suitable pressure to allow contact between the relief image on the plate and the material.

Whenever relief areas contact the printed surface, one gets a substantially solid colour area. To create a grey scale, a half-toning process is used. Using this process grey tones are reproduced by printing a plurality of solid dots per unit area and varying either the frequency of the dots per unit area and/or the size of the dots or both.

It was a problem in flexographic printing that solid areas, that is areas in the image where there are no halftone dots, as well as halftone areas are difficult to print. To address this problem it is known to use surface patterning. This technique consists in arranging a plurality of small wells or pins in and/or on the top surface of the solid areas. In that way the ink on the solid areas is better distributed, increasing the uniformity and saturation in the printed image. This surface patterning technique has also been used in halftone areas. However, when the size of a half-tone dot is relatively small, it has been found that the small wells and/or pins in/on the top surface of a halftone dote may destabilize the halftone dot.

There is thus a need for flexographic printing plates that at least partially alleviate these problems and for a method preferably implemented at least partially through software, to produce such plates.

SUMMARY OF THE INVENTION

Embodiments of the invention aim to provide a flexographic printing plate allowing improved printing of halftone areas and methods preferably implemented at least partially through software and/or electronics, to produce such plates.

According to a first aspect of the invention there is provided a flexographic printing plate comprising at least one halftone printing area with a plurality of halftone dots. A halftone dot of said plurality of halftone dots is shaped as a relief area comprising a central portion and a surrounding portion. The central portion has a central dot floor with a first pattern of a plurality of pins protruding upwardly from the central dot floor. The surrounding portion protrudes upwardly from the central dot floor and has a top side comprising a second pattern of a plurality of recesses. The first pattern and second pattern are such that the surrounding portion can be distinguished from the central portion.

Embodiments are based inter alia on the inventive insight that the upwardly protruding pins in the central portion will ensure that the ink is distributed and spread out in an improved manner across the central portion whilst avoiding that too much ink is necessary. On the one hand, the surrounding portion will ensure that also for small halftone dots the relief is sufficiently stable whilst on the other hand the recesses in the surrounding portion will allow obtaining a good transition between adjacent halftone dots, improving ink lay-down. By providing the surrounding portion the stability of a halftone dot is improved, thereby allowing the pressure during printing and hence the productivity to be increased. The second pattern of recesses in the surrounding portion in combination with the pins in the central portion will ensure that smoother halftone vignettes, in which the background fades gradually away until it blends into the unprinted paper or into white, are obtained.

In an exemplary embodiment the relief area is substantially circular. The diameter of the relief area is preferably between 10 and 1000 micrometre, more preferably between 10 and 500 micrometre.

In an exemplary embodiment the surrounding portion is a substantially ring shaped portion.

In an exemplary embodiment the plurality of recesses comprise any one or more of the following: depressions, wells or pits, grooves. The grooves may run from an inner edge of the surrounding portion to an outer edge of the surrounding portion and may be applied parallel to each other. Preferably the plurality of recesses is distributed evenly across the surrounding portion.

In an exemplary embodiment the first pattern is distinct from the second pattern.

In an exemplary embodiment, seen in a top surface of the halftone dot, the pins form the first pattern, and the top side of the surrounding portion adjacent the recesses therein form a third pattern complementary to the second pattern of the recesses, and the third pattern is different from the first pattern. In other words, in certain embodiments the first and second pattern may be the same, e.g. the grid of pins in the central portion may be the same as the grid of recesses in the surrounding portion, but the third pattern formed by the area around the recesses, i.e. the area which has a top surface at the same level as the pins, is different from the first pattern.

In an exemplary embodiment the plurality of recesses have a depth which is larger than 1 micrometre, preferably larger than 2 micrometre, more preferably larger than 5 micrometre, most preferably larger than 10 micrometre, and e.g. between 20 and 70 micrometre.

In an exemplary embodiment, seen in a top surface of the surrounding portion, the surface area of the plurality of recesses is at least 1% of the surface area of the surrounding portion, preferably at least 5% of the surface area of the surrounding portion, more preferably at least 20%. In an exemplary embodiment the surface area of the plurality of recesses is between 5 and 50% of the surface area of the surrounding portion In an exemplary embodiment the plurality of pins have a height which is larger than 1 micrometre, preferably larger than 2 micrometre, more preferably larger than 5 micrometre, most preferably larger than 10 micrometre, and e.g. between 20 and 70 micrometre.

In an exemplary embodiment the plurality of pins have dimensions, seen in the plane of the central dot floor, between 1 and 100 micrometre, preferably between 5 and 50 micrometre, and e.g. between 5 and 20 micrometre.

In an exemplary embodiment the plurality of pins are distributed evenly across the central portion. The pins typically have a pillar shape with a substantially square, rectangular or round cross section, or a shape between square and round. The pillar shape may be conical or pyramidal, or substantially cylindrical. When diffuse light is used, the shape may be more conical or pyramidal, but when LED or laser light is used the walls of the pins may be more vertical. The skilled person understands that the shape will be dependent on the process used for creating the pins.

In an exemplary embodiment, seen in a plane of the central dot floor, the surface area of the plurality of pins is smaller than the surface area of the central dot floor.

In an exemplary embodiment, seen in the plane of the central dot floor, the surface area of the plurality of pins is larger than 5% of the surface area of the central portion, preferably between 5% and 75% of the surface area of the central portion, more preferably between 10% and 50%, and most preferably between 15 and 40%.

According to another aspect there is provided a method for generating a plate layout for making a flexographic printing plate. The plate layout represents an image having solid image areas, halftone image areas, and areas that need not be printed. The method comprises the steps of: receiving digital values representing point by point an image to be printed; and generating a plate layout in which the digital values have been converted into binary data allowing to form the halftone image areas and the solid image areas, wherein for the halftone image areas at least a tile associated with a halftone dot is calculated. The tile contains a plurality of pixels arrayed in two dimensions. The tile is calculated such that it contains a central portion with a first pattern of a plurality of pins, and a surrounding portion comprising a second pattern of a plurality of recesses. The plurality of pins is represented by a binary value different from the rest of the central portion. The plurality of recesses is represented by a binary value different from the plurality of pins and different from the rest of the surrounding portion. The first pattern and second pattern are such that the surrounding portion can be distinguished from the central portion.

According to another aspect there is provided a method for making a flexographic printing plate. The method comprises a method for generating a plate layout as set out above, and using the generated plate layout to make the flexographic printing plate. This may involve: producing a screened film intermediate using the generated plate layout, and using said screened film intermediate to write the flexographic printing plate; or removing portions of a laminated layer, e.g. a carbon layer of the flexographic printing plate using the generated plate layout, and writing the flexographic printing plate through the removed portions of the laminated layer; or using the generated plate layout to produce directly the flexographic printing plate.

In an exemplary embodiment the central portion in the tile is substantially circular, and the surrounding portion in the tile is substantially ring shaped.

In an exemplary embodiment the plurality of pixels of the tile represents an area with a length and width dimension between 10 and 1000 micrometre, more preferably between 10 and 500 micrometre.

In an exemplary embodiment each recess of the plurality of recesses is represented by a group of adjacent pixels, said group of adjacent pixels preferably having a step-shape. Such a step shape will allow creating recesses in the form of grooves.

In an exemplary embodiment the number of pixels representing the plurality of recesses is at least 1% of the total number of pixels representing the surrounding portion, preferably at least 5%, more preferably at least 20% and e.g. between 5% and 50%.

In an exemplary embodiment pixels representing the plurality of recesses are distributed evenly across the surrounding portion. In an exemplary embodiment pixels representing the plurality of pins are distributed evenly across the central portion.

In an exemplary embodiment the number of pixels representing the plurality of pins is more than 5% of the total number of pixels representing the central portion, preferably between 5% and 75% of the total number of pixels representing the central portion, more preferably between 10% and 50%, and most preferably between 15% and 40%.

According to an exemplary embodiment the flexographic printing plate is made of rubber or of a variety of radiation sensitive polymer resins, typically sensitive to ultraviolet radiation. The flexographic photosensitive polymer resin plate may be a solvent based plate configured to be developed using a solvent, a water based plate configured to be developed using water, a thermal based plate configured to be developed by heating, a direct write plate, etc.

According to a further aspect of the invention, there is provided a computer program comprising computer-executable instructions to perform the method, when the program is run on a computer, according to any one of the steps of any one of the embodiments disclosed above.

According to a further aspect of the invention, there is provided a computer device or other hardware device programmed to perform one or more steps of any one of the embodiments of the method disclosed above. According to another aspect there is provided a data storage device encoding a program in machine-readable and machine-executable form to perform one or more steps of any one of the embodiments of the method disclosed above.

BRIEF DESCRIPTION OF THE DRAWINGS

The accompanying drawings are used to illustrate presently preferred non-limiting exemplary embodiments of devices of the present invention. The above and other advantages of the features and objects of the invention will become more apparent and the invention will be better understood from the following detailed description when read in conjunction with the accompanying drawings, in which:

FIGS. 5A-5C illustrate top views of a halftone area of a plate according to an exemplary embodiment for different dot coverage percentages;

FIGS. 6A-6C illustrate perspective views of a halftone area of a plate according to an exemplary embodiment for different dot coverage percentages;

FIGS. 7A and 7B illustrate gradient circles and strips using an embodiment without a second pattern and with a second pattern on the surrounding portion of the halftone dots, respectively.

DESCRIPTION OF THE INVENTION

Figure 1:
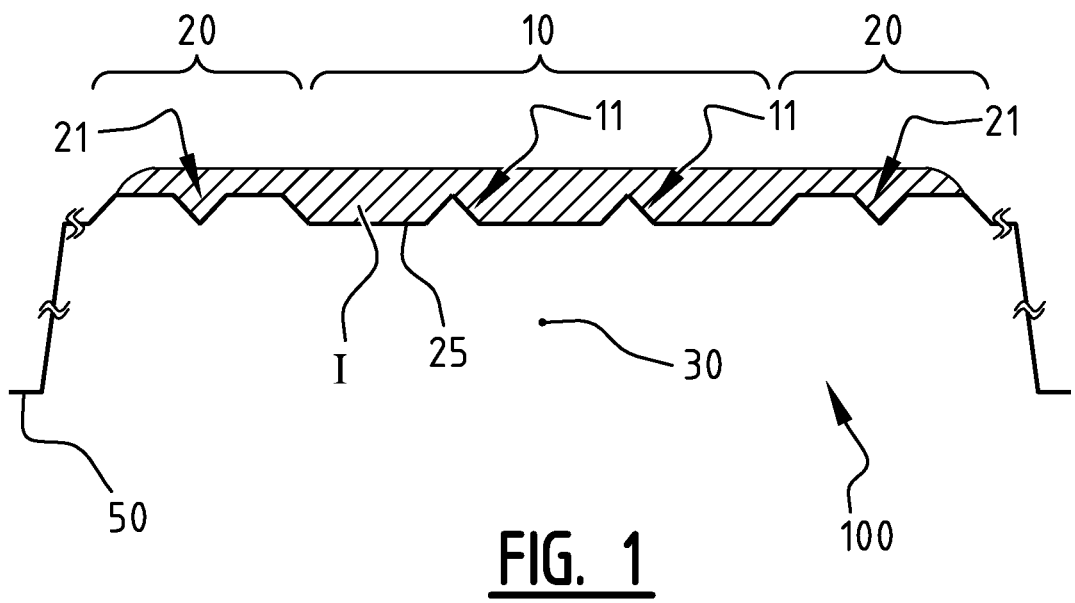
FIG. 1 illustrates schematically a cross section of a halftone dot in an exemplary embodiment.

Throughout the following detailed description, similar reference numerals refer to similar elements in all figures of the drawings.

Images typically reproduced by flexographic plates typically include both solid image areas and a variety of grey tone areas, also called halftone areas. By solid areas we mean image areas completely covered by ink having the highest density the ink can produce on a print material. By grey tone or halftone areas we mean image areas where the appearance of the printed image is of a density intermediate to pure white (total absence of ink) and solid. Grey areas are produced by the process of half-toning, wherein a plurality of relief surface areas per unit area is used to produce the illusion of different density printing. These relief areas are commonly referred to in the printing industry as "halftone dots". Image presentation is achieved by changing a percentage of area coverage (dot intensity) from region to region. Dot intensity may be altered by altering the dot size and/or the dot density, i.e. the dot frequency.

In a flexographic plate, the halftone dots are relief areas having their surface at the top surface of the plate. The plate in the area surrounding the dot has been etched to a depth which reaches to a floor. The height of a halftone dot is the distance of the surface of the dot (and of the plate surface) to the floor. The halftone relief is the relief extending from the floor to the top surface. This relief may decrease as the dot coverage percentage increases, but will be sufficient to confine ink to the dot surface.

The invention relates to an improved technique for printing with flexographic printing plates, and in particular a technique which allows obtaining good results when printing halftone areas with halftone dots. Such a halftone dot is shaped preferably as a substantially circular relief area of the printing plate.

Figure 2:
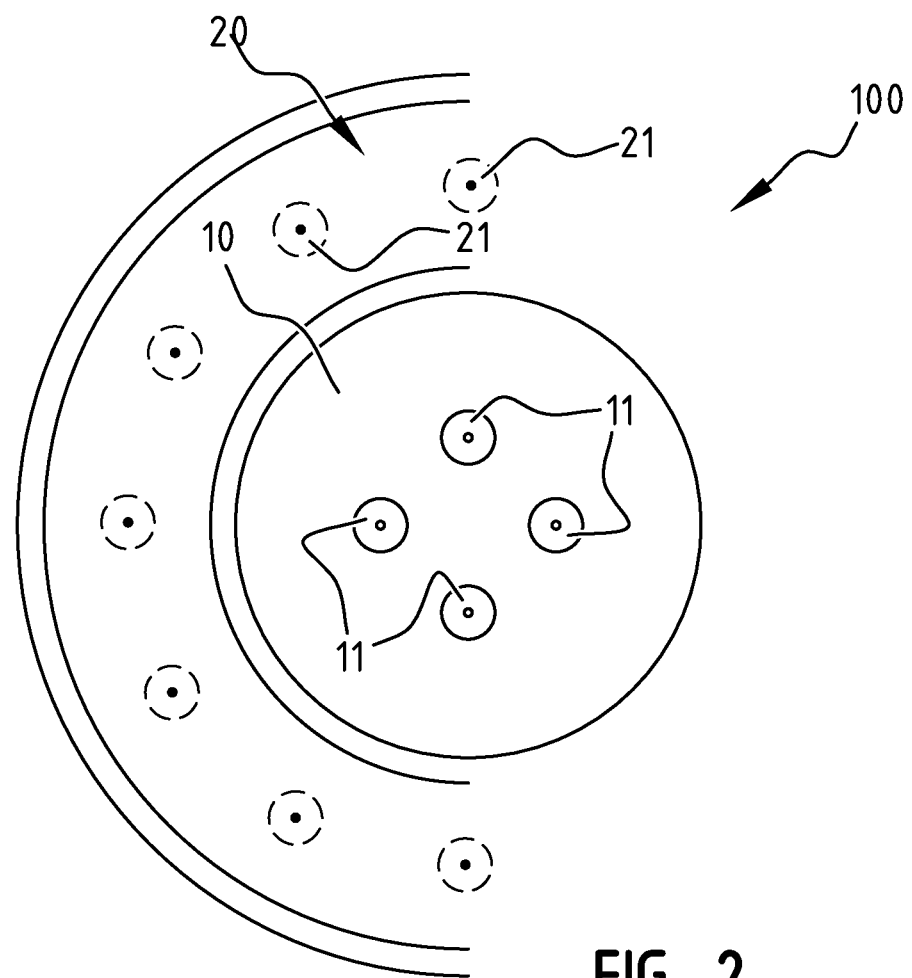
FIG. 2 illustrates schematically a top view of the halftone dot of FIG. 1.

FIGS. 1 and 2 illustrate a cross section and a top view of a halftone dot with a substantially circular relief area 30 of a flexographic printing plate. The halftone dot can have a diameter between 10 and 1000 micrometre, e.g. about 50 μm. The relief area 30 comprises a central portion 10 surrounded by a surrounding portion, here a ring portion 20. The central portion 10 has a central dot floor 25 with a first pattern of a plurality of pins 11 protruding upwardly from the central dot floor 25. The ring-shaped portion 20 protrudes upwardly from the central dot floor 25 and is provided with a plurality of recesses 21. The recesses 21 may be small depressions, wells or pits, but may also be grooves, see FIG. 3. More generally any pattern of recesses may be used.

The upwardly protruding pins 11 in the central portion 10 will ensure that the ink is distributed/spread out in an improved manner across the central portion 10 whilst avoiding that too much ink is necessary. The recesses 21 in the protection ring 20 will weaken ring 20 and will allow obtaining a good transition between adjacent halftone dots and improving ink lay-down.

These recesses 21 do not extend to the floor 50 but are rather shallow in depth and are arrayed in a much higher frequency pattern than the halftone dots 100. The recesses 21 may have a depth e.g. between 1 and 70 micrometre. For example the halftone dot pattern in flexographic plates is of the order of a 75-200 lines per inch while the recesses are arrayed at frequencies which are e.g. at least ten times higher. The shallow recesses 21 and the shallow areas between pins 11 behave as anchor regions for the ink film I creating a substantially even ink distribution.

Seen in a top surface of the surrounding portion 20, the surface area of the recesses 21 is preferably at least 30% of the surface area of the surrounding portion, preferably at least 40% of the surface area of the surrounding portion. Preferably, the recesses 21 are distributed evenly across the surrounding portion 20.

The pins 11 may have a height e.g. between 10 and 70 micrometre. The pins 11 may be distributed evenly across the central portion 10, but also other patterns are possible, e.g. less dense towards the centre of the central portion 10. The pins 11 may have dimensions, seen in a section parallel to the central dot floor 25, between 1 and 100 micrometre. Seen in a top surface of the central portion 10, the surface area of the pins 11 may be between e.g. 10% and 50% of the surface area of the central portion, preferably between 15% and 40%.

Figure 3:
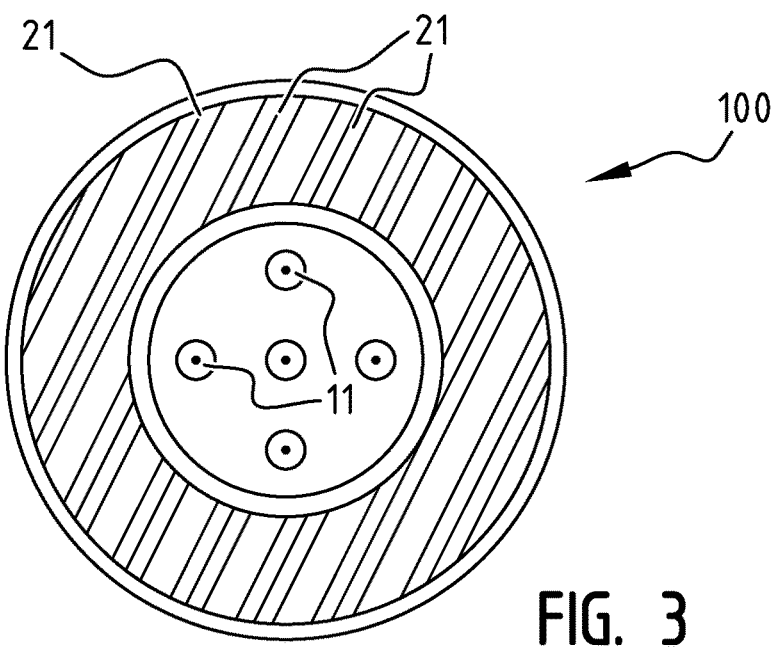
FIG. 3 illustrates schematically a top view of a halftone dot according to an exemplary embodiment.

In the embodiments of FIGS. 1-3 the first pattern of the pins 11 is distinct from the second pattern of the recesses 21. However, in the embodiment of FIGS. 1 and 2, the first pattern could be identical to the second pattern in the sense that the dimensions of the pins 11 and recesses 21 could be the same and that the pins 11 could be arranged in a grid with the same spacing between adjacent pins 11 as between adjacent recesses 21. However, seen in a top surface of the halftone dot, the area(s) of the surrounding portion arranged around/adjacent the recesses 21 form(s) a third pattern complementary to the second pattern of the recesses 21, and the third pattern is different from the first pattern. In fact the third pattern is the inverse of the first pattern, making the surrounding portion 20 distinguishable from the central portion 10.

To produce an embodiment of a flexographic printing plate according to the present invention, typically first a plate layout of the image to be printed is generated. A plate layout is a binary representation of the continuous tone image in which grey scale tones have been reproduced as halftones. When multiple colour printing is involved there will be a plurality of such plate layouts each representing a colour separation as is well known in the art. These plate layouts may then be used by a computer controlled film exposure device such as an image setter, e.g. a laser printer, and an associated suitably programmed computer with software to write the flexographic printing plate, either directly of via a film intermediate or laminate layer, see further. The software may receive digital values representing point by point a continuous tone original image. In an 8 bit system, these values range from 0-255, with white being at one end of the scale and black at the other. Depending on whether the system is a negative or a positive working system, 0 or 255 represent a fully inked or solid area. We will assume in this discussion that solids are represented by the digital value 255. The software next screens the image, that is generates a plate layout in which the 8 bit digital values have been converted to binary (on-off) data that is fed to an image setter to control the exposing beam on or off in a way to form the solid areas and the halftone areas with halftone dots. To form a solid area, the exposing source may be ON all the time it is scanning the solid area. A halftone dot is created within a tile consisting of a plurality of pixels usually representing the minimum spot size of the exposing source. A plurality of adjacent tiles forms an image area of the plate layout. The source is then used to obtain a dot shape by exposing preselected pixels within each tile. The exposing source may be e.g. a laser having e.g. a laser beam focussed to a pixel size of a few microns, e.g. 1 to 20 microns. In other words, to make a halftone dot, a tile is first calculated. The tile consists of a predetermined number of pixels arrayed in two dimensions along the scanning path of the source. These tiles are repeated side by side to cover an area, or may be distributed more or less randomly across an area. Depending on the desired grey scale, the tile may contain adapted patterns for the central portion and/or for the surrounding portion, and/or the distance between adjacent tiles may be varied. The most common halftone dot shape is one that approximates a circle, but the skilled person understands that other shapes, e.g. an ellipse shape, are possible.

Figure 4:
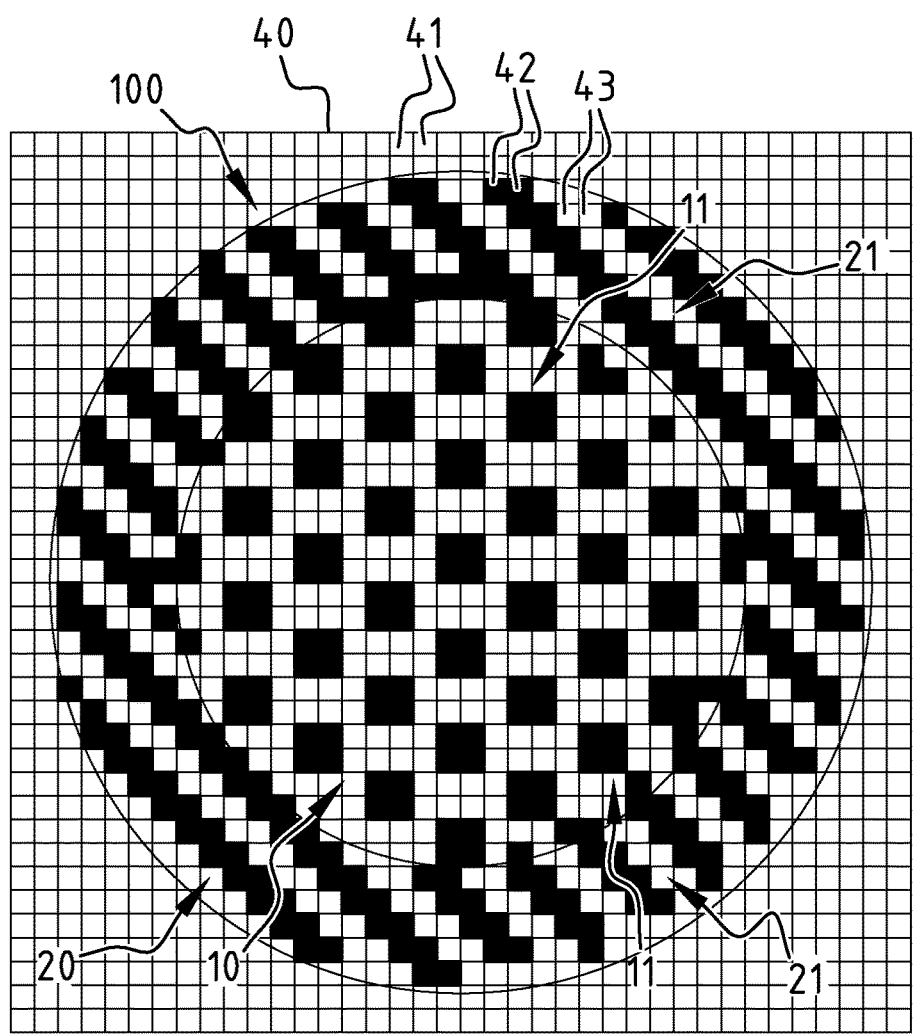
FIG. 4 illustrates schematically a tile for use in exemplary embodiments of the invention.

FIG. 4 shows an exemplary tile 40 of a plate layout used to generate a halftone dot using an image setter controlled by software. This example shows a tile 40 in the form of an 38*38 pixel array. Each of the pixels 41 in the tile 40 is associated by a digital address. To generate a halftone dot, the exposure source, e.g. a scanning laser exposes a number of pixels 43 within a tile 40 whilst not exposing other pixels 42 in the tile. This number may be related to the % halftone dot called for in that area of the plate. The exposed pattern of pixels is such that a substantially circular dot 100 is formed having a central portion 10 with a number of pins 11 and a ring shaped portion 20 with a plurality of recesses 21.

Figure 8:
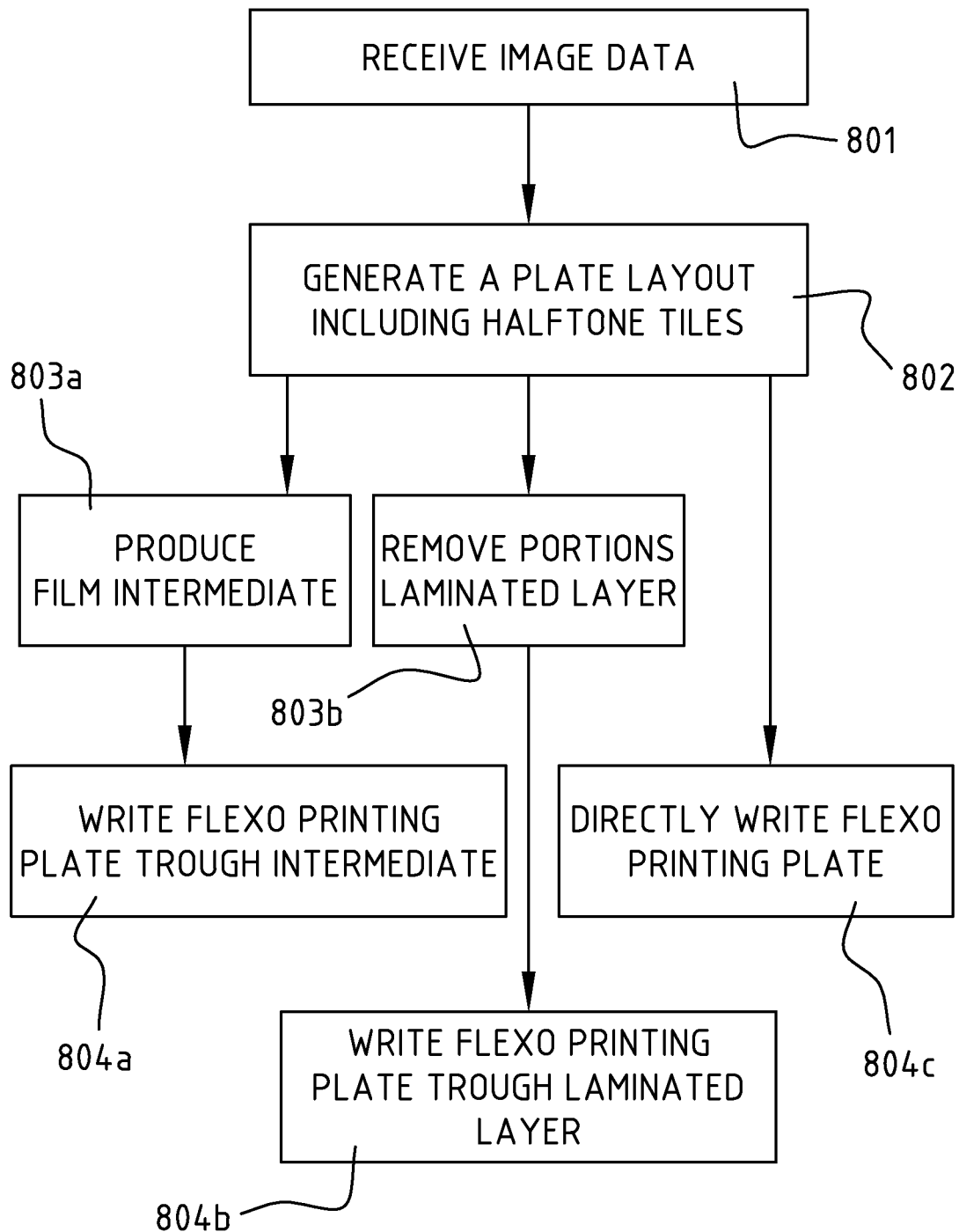
FIG. 8 illustrates a flow chart of an exemplary embodiment of the method of the invention.

FIG. 8 illustrates an embodiment of the method of the invention for making a flexographic printing plate. In a first step 801 digital values representing point by point an image to be printed are received. In a second step 802 a plate layout in which the digital values have been converted into binary data allowing forming the halftone image areas and the solid image areas, is generated. In step 802, for generating the halftone image areas of the plate layout, at least a tile associated with a halftone dot is calculated, said tile containing a plurality of pixels arrayed in two dimensions. The tile is calculated such that it contains a central portion with a first pattern of a plurality of pins, the plurality of pins being represented by a binary value different from the rest of the central portion; and a surrounding portion comprising a second pattern of a plurality of recesses, the plurality of recesses being represented by a binary value different from the rest of the surrounding portion. The the first pattern and second pattern are such that the surrounding portion can be distinguished from the central portion.

In an embodiment, the generated plate layout is used to produce a screened film intermediate, see step 803a. This film intermediate is placed on a photopolymerizable plate and the plate is exposed through the screened film intermediate to radiation, e.g. UV radiation, see step 804a. The polymer material under the exposed pixels 43 remains unpolymerized. Following UV radiation the unpolymerized areas in the plate are washed off.

In another embodiment the generated plate layout is used for removing, e.g. by laser burning, portions of a laminated layer, e.g. a carbon layer, of the flexographic printing plate, see step 803b. The flexographic printing plate may then be written through the removed portions of the laminated layer, see step 804b.

In yet other embodiments, the use of a physical screened intermediate (as in steps 803a and 803b) may be omitted and the photopolymerizable plate may be produced directly using the generated plate layout, see step 804c. Two variants thereof exist. According to a first variant in a first step the flexographic plate comprises a soft rubber layer which is written, e.g. using UV light, and in a following step the non written areas are removed. According to a second variant the flexographic plate comprises a hard rubber layer which is ablated, using e.g. a powerful $CO_2$ or infrared laser, such that material is removed where needed and no further step is necessary. The software may then control directly either a radiation source, e.g. a UV light source or a powerful laser to produce without intermediate a printing plate comprising halftone areas of embodiments of the invention.

Halftone relief may be controlled by a number of other factors, including the process used to remove the material from the between the dots. In a photopolymer flexographic printing plate the maximum relief may be controlled by the back exposure of the plate which hardens the photopolymer to a given depth and establishes a maximum relief.

The resulting plate can be mounted on a printing roller. In order to produce good quality images the ink is preferably applied to the printing material in a uniform and predictably manner. This in turn requires that the relief areas in the flexographic plate carry ink in a uniform layer and in predictable amounts. The amount of ink applied to the printing plate may be controlled using a metering roller, e.g. an anilox roller. Anilox rollers have on their surface a cell pattern comprising a plurality of ink metering cells.

In embodiments of the invention the plate ink carrying capacity per unit area is preferably less than the ink carrying capacity of the anilox roller that is being used to transfer ink to the flexographic plate. Preferably the size of the recesses and the pins are adapted in function of the size of the cells of the anilox roller.

FIGS. 5A, 5B, and 5C show top views of a halftone area of a plate for three dot coverage percentages, namely 50%, 80%, and 85%, and FIGS. 6A, 6B, and 6C show perspective views of a halftone area of a plate for three dot coverage percentages, namely 50%, 80%, and 85%. The increased percentage is realised by increasing the halftone dot size: in FIG. 5A the percentage is 50% and the number of pins 11 (shown in white) in the central portion 10 is approximately eight; in FIG. 5B the percentage is 85% and the number of pins 11 (indicated in white) in the central portion 10 is approximately twenty; etc. The surrounding portions 20 are provided with grooves 21. The areas between the grooves 21 are shown in white in FIGS. 5A-5C and 6A-6C, and the grooves 21 are shown in black. As the percentage area coverage increases, the halftone dots 100 eventually contact and merge with each other. After a predetermined coverage percentage is reached one no longer has isolated relief areas per halftone dot 100, but instead isolated holes separating the halftone dots 100 can be seen, see FIGS. 5B, and 5C. The holes extend from the surface of the plate toward the floor. The ring shaped portions 20 of the halftone dots merge with each other, see FIGS. 5B and 5C.

FIGS. 7A and 7B illustrate gradient circles and strips using an embodiment without a second pattern and with a second pattern on the surrounding portion of the halftone dots, respectively. It can be seen that for the embodiment with a solid surrounding portion (FIG. 7A), i.e. a surrounding portion without a second pattern of recesses, the gradient circles show abrupt changes at C1 and C2. Using an embodiment of the invention with a surrounding portion in which a second pattern of recesses is arranged (FIG. 7B), the gradient circles vary more smoothly. By providing the surrounding portion the stability of a halftone dot is improved, thereby allowing the pressure during printing and hence the productivity to be increased. The second pattern of recesses in the surrounding portion in combination with the pins in the central portion ensures that smooth halftone gradients are obtained, in which the background fades gradually away until it blends into the unprinted paper.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media, hard drives, or optically readable digital data storage media. The embodiments are also intended to cover computers programmed to perform said steps of the above-described methods.

Whilst the principles of the invention have been set out above in connection with specific embodiments, it is to be understood that this description is merely made by way of example and not as a limitation of the scope of protection which is determined by the appended claims.

The invention claimed is:

1. A flexographic printing plate comprising at least one halftone printing area with a plurality of halftone dots;
   wherein a halftone dot of said plurality of halftone dots is shaped as a relief area;
   said relief area comprising a central portion and a surrounding portion;
   said central portion having a central dot floor with a first pattern of a plurality of pins protruding upwardly from the central dot floor;
   said surrounding portion protruding upwardly from the central dot floor and having a top side comprising a second pattern of a plurality of recesses;
   wherein the first pattern and second pattern are such that the surrounding portion can be distinguished from the central portion.

2. The flexographic printing plate of claim 1, wherein the relief area is substantially circular.

3. The flexographic printing plate of claim 1, wherein the diameter of the relief area is between 10 and 1000 micrometres.

4. The flexographic printing plate of claim 1, wherein the surrounding portion is a substantially ring shaped portion.

5. The flexographic printing plate of claim 1, wherein the plurality of recesses comprise any one or more of the following: depressions, wells or pits, grooves.

6. The flexographic printing plate of claim 1, wherein the first pattern is distinct from the second pattern; and/or
   wherein, seen in a top surface of the halftone dot, the top side of the surrounding portion adjacent the recesses therein form a third pattern complementary to the second pattern of the recesses, and the third pattern is different from the first pattern.

7. The flexographic printing plate of claim 1, wherein, seen in a top surface of the surrounding portion, the surface area of the plurality of recesses is at least 1% of the surface area of the surrounding portion.

8. The flexographic printing plate of claim 1, wherein the plurality of recesses are distributed evenly across the surrounding portion.

9. The flexographic printing plate of claim 1, wherein the plurality of pins have a height which is higher than 1 micrometre; and/or wherein the plurality of recesses have a depth which is higher than 1 micrometre.

10. The flexographic printing plate of claim 1, wherein the plurality of pins are distributed evenly across the central portion.

11. The flexographic printing plate of claim 1, wherein the plurality of pins have dimensions, seen in the plane of the central dot floor, between 1 and 100 micrometre.

12. The flexographic printing plate of claim 1, wherein, seen in the plane of the central dot floor, the surface area of the plurality of pins is larger than 5% of the surface area of the central portion.

* * * * *